(12) United States Patent
Orikabe

(10) Patent No.: US 6,433,123 B2
(45) Date of Patent: *Aug. 13, 2002

(54) CURABLE RESIN COMPOSITION FOR OVERCOAT OF FLEXIBLE CIRCUIT

(75) Inventor: Hiroshi Orikabe, Kawasaki (JP)

(73) Assignee: Ajinomoto Co., Inc., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/418,506

(22) Filed: Oct. 15, 1999

(30) Foreign Application Priority Data

Oct. 15, 1998 (JP) .......................................... 10-293198

(51) Int. Cl.$^7$ .............................................. C08G 18/81
(52) U.S. Cl. ............................. 528/45; 528/60; 528/65; 528/75; 528/85; 525/124; 427/385.5; 428/423.1
(58) Field of Search ............................. 528/75, 60, 65, 528/45, 85; 525/124

(56) References Cited

U.S. PATENT DOCUMENTS 4,102,716 A * 7/1978 Groves et al. ................. 156/48
4,267,299 A * 5/1981 Oechsle ........................ 528/48
4,937,305 A   6/1990 Okamoto et al. .............. 528/65
6,162,889 A * 12/2000 Orikabe et al. ................ 528/75

FOREIGN PATENT DOCUMENTS

| EP | 0 829 497 | 3/1998 |
|---|---|---|
| EP | 0 896 971 | 2/1999 |

OTHER PUBLICATIONS

Patent Abstract of Japan, vol. 1996, No. 10, Oct. 31, 1996, JP 08 165454, Jun. 25, 1996.

Patent Abstracts of Japan, vol. 011, No. 268 (C–444), Aug. 26, 1987, JP 62 072749, Apr. 3, 1987.

* cited by examiner

*Primary Examiner*—Rachel Gorr
(74) *Attorney, Agent, or Firm*—Oblon, Spivak, McClelland, Maier & Neustadt, P.C.

(57) ABSTRACT

Herein are disclosed a curable resin composition for overcoat of flexible circuit which comprises a hydrogenated polybutadiene polyol with a number-average molecular weight of 1,000–8,000 and having 2–10 hydroxyl groups per molecule (Polyol A), and a polybutadiene polyblock isocyanate (Isocyanate X), and other similar curable resin compositions, which can be an overcaoting agent which can give a coat film involving no such trouble that the coat film gets overhardened and the curling is increased.

19 Claims, No Drawings

1

CURABLE RESIN COMPOSITION FOR OVERCOAT OF FLEXIBLE CIRCUIT

BACKGROUND OF THE INVENTION

1. Field of the Invention

This invention relates to thermosetting resin compositions for overcoats of flexible circuits, which are excellent in low shrinkage during curing and flexibility, and particularly in that the resulting overcoats are difficult to deteriorate in qualities, e.g., to overharden, to increase in curling, and the like, even after being allowed to stand for a long time at elevated temperatures. It relates also to a film carrier coated with an overcoat agent comprising, as the main ingredient, such a resin composition for overcoat of flexible circuit, as well as to a film device where such film carrier is used.

2. Prior Art

The surface protective films of flexible wiring circuits have heretofore been formed, e.g., by cutting polyimide films, called as coverlay films, using a die made corresponding to the pattern, which are then adhered onto a substrate with an adhesive, or by applying a ultraviolet rays- curable or thermosetting overcoat composition the film from which is imparted with flexibility, according to the screen printing method, followed by curing. However, the coverlay film method is undesirable in workability, and the method where an overcoat agent is used is unsatisfying in curling upon curing and also in flexibility, and there have been known no methods of forming surface protective films for flexible wiring circuits which can meet the required performances.

On the other hand, recently, the so-called TAB method has got increasingly employed where film carriers which are, as an IC package for liquid-crystals driving, suitable for high-densifying or thinning. The basic structure of a film carrier is mainly composed of heat-resistant, insulating film base such as polyimide or the like, and an electrical conductor such as copper foil or the like, glued onto the film base through an adhesive layer composed mainly of an epoxy resin as the main ingredient, the wiring pattern having been formed on the copper foil by etching. And, a film carrier device is made by connecting an IC to such tape carrier followed by confining with the use of a confining resin. To prevent the reliability from being decreased due to pattern shortening, erosion, migration, whisker occurrence, or the like, a surface protective film is usually formed on such film carrier, using an overcoat agent. As such overcoat agent for film carriers, an epoxy-based one and a polyimide-based one are used. However, the former has not been satisfactory in curling during curing and flexibility of the coat film formed, and the latter has not been satisfactory in adhesiveness to the IC confining resin, workability or the like. For these reasons, at present, two or more different overcoat agents are concurrently used to compensate each other (See Japanese patent application laid-open (kokai) No. 283,575/'94) .

On the other hand, the present inventor had studied intensively to solve the above problems, and, as the results, found that curable resin compositions having properties required, e.g., of overcoats for flexible circuit, such as low shrinkage during curing, and whose cured products have satisfactory properties such as flexibility, adherence, electrical insulation, chemical resistance, heat resistance, etc., can be prepared by mixing a polyol with a number-average molecular weight of 1,000–8,000 and having 2–10 hydroxyl groups per molecule, or a polyol with a number-average molecular weight of 200–600 and having 2–10 hydroxyl groups per molecule, with a polyol with a number-average molecular weight of 13,000–30,000 and having 2–10 hydroxyl groups per molecule, and a polyblock isocyanate, and that, inter alia, a polyol or a polyblock isocyanate each having a polybutadiene skeleton is effective in providing flexibility and low shrinkage during curing. See Japanese patent applications Nos. 219,610/'97 and 219,611/'97.

An overcoat formed by using a resin composition comprising an ingredient with a polybutadiene skeleton is, however, apt to be oxidized, and therefore, undergo such changes that the coat film gets overhardened and the curling is increased, when it is left, e.g., in an elevated-temperature environment.

In particular, if such resin composition is used as an overcoating agent for printed circuit bases such as flexible circuit, there may be involved such trouble that the coat film gets overhardened and the curling is increased, because such printed circuit bases are made to pass, during their production process, through more than 150° C. environment, several times or for a long time.

SUMMARY OF THE INVENTION

Problems to be Solved by the Invention

It is an object of the present invention to provide an overcaoting agent which can give a coat film involving no such trouble that the coat film gets overhardened and the curling is increased. Other objects will be apparent from what will be described below.

Means for solving the problems

The present inventor has studied intensively to solve the above problems, and as the results, found that the use of a resin whose double bonds in the polybutadiene skeleton, have been added with hydrogen atoms, i.e., a resin which has a hydrogenated polybutadiene skeleton, can avoid the above-mentioned trouble. The present invention has been completed on the basis of these findings.

Accordingly, the present invention relates to:

1. A curable resin composition for overcoat of flexible circuit which comprises a hydrogenated polybutadiene polyol with a number-average molecular weight of 1,000–8,000 and having 2–10 hydroxyl groups per molecule (Polyol A), and a polybutadiene polyblock isocyanate (Isocyanate X);

2. A curable resin composition for overcoat of flexible circuit which comprises a hydrogenated polybutadiene polyol with a number-average molecular weight of 1,000–8,000 and having 2–10 hydroxyl groups per molecule (Polyol A), and a hydrogenated polybutadiene polyblock isocyanate with a number-average molecular weight of 1,000–8,000 and having 2–10 blockisocyanate groups per molecule (Isocyanate Xa), said hydrogenated polybutadiene polyblock isocyanate (Isocyanate Xa) being in an amount of 0.8–3.5 gram equivalents based on (i.e., per) one gram equivalent of the total hydroxyl groups of said Polyol A;

3. A curable resin composition for overcoat of flexible circuit which comprises a hydrogenated polybutadiene polyol with a number-average molecular weight of 1,000–8,000 and having 2–10 hydroxyl groups per molecule (Polyol A), a hydrogenated polybutadiene polyblock isocyanate with a number-average molecular weight of 1,000–8,000 and having 2–10 blockisocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of said two polyols is (Polyol A):(Polyol B)=40:60–90:10, and said polyblock isocyanate (Isocyanate Xa) is in an amount of 0.8–3.5 gram equivalents based on, i.e., per one gram equivalent of, the total hydroxyl groups of the two polyols (Polyol A plus Polyol B);

4. A curable resin composition for overcoat of flexible circuit which comprises a polyol with a number-average molecular weight of 200–600 and having 2–10 hydroxyl groups per molecule (Polyol C), a hydrogenated polybutadiene polyblock isocyanate with a number-average molecular weight of 1,000–8,000 and having 2–10 blockisocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of the two polyols is (Polyol C):(Polyol B)=20:80–50:50 and said polyblock isocyanate (Isocyanate Xa) is in an amount of 0.8–3.5 gram equivalents based on one gram equivalent of the total hydroxyl groups of the polyols;

5. The curable resin composition for overcoat of flexible circuit as set forth above which further comprises fine rubber particles and/or fine polyamide particles;

6. A film carrier coated on the circuit pattern surface side, with an overcoat agent comprising, as the main ingredient, a curable resin composition for overcoat of flexible circuit as set forth above; and 7. A film carrier device which comprises the film carrier as set forth above.

DETAILED DESCRIPTION OF THE INVENTION

A hydrogenated polybutadiene polyol with a number-average molecular weight of 1,000–8,000 and having 2–10 hydroxyl groups per molecule (Polyol A) is important to impart properties to cured products, for example, those observed for resins having a higher crosslinking density such as heat resistance, chemical resistance, and the like, as well as those observed for resins having a lower crosslinking density such as flexibility, low shrinkage, and the like, in the way where the two kinds of properties are well balanced. If the molecular weight is below this range or if the number of hydroxyl groups per molecule exceeds this range, the crosslinking density upon curing becomes higher, providing harder cured products and insufficient properties for low shrinkage upon curing and flexibility of a cured film. On the other hand, if the molecular weight exceeds said range or if the number of hydroxyl groups per molecule is below said range, the crosslinking density upon curing becomes lower, providing more flexible cured products while significantly deteriorating heat resistance and chemical resistance of the cured film.

A hydrogenated polybutadiene polyblock isosyanate with a number-average molecular weight of 1,000–8,000 and having 2–10 blockisocyanate groups per molecule (Isocyanate Xa) is, like Polyol A, important to impart properties to cured products, for example, those observed for resins having a higher crosslinking density such as heat resistance, chemical resistance, and the like, as well as those observed for resins having a lower crosslinking density such as flexibility, low shrinkage, and the like, in the way where the two kinds of properties are well balanced. If the molecular weight is below this range or if the number of hydroxyl groups per molecule exceeds this range, the crosslinking density upon curing becomes higher, providing harder cured products and insufficient properties for low shrinkage upon curing and flexibility of a cured film. On the other hand, if the molecular weight exceeds said range or if the number of blockisocyanate groups per molecule is below said range, the crosslinking density upon curing becomes lower, providing more flexible cured products while significantly deteriorating heat resistance and chemical resistance of the cured film.

A hydrogenated polybutadiene polyol with a number-average molecular weight of 13,000–30,000 and having 2–10 hydroxyl groups per molecule (Polyol B) is important to decrease the crosslinking density, whereby properties such as low shrinkage upon curing and flexibility and the like of the cured products are much improved.

A polyol with a number-average molecular weigh of 200–600 and having 2–10 hydroxyl groups per molecule (Polyol C) is important to increase the crosslinking density whereby the cured products are improved in heat resistance and chemical resistance.

When a polyol (A) and a blockisocyanate (Xa) are cured together, the chemical and heat resistances of the cured products are considerably well balanced with the low shrinkage upon curing and flexibility. In order to decrease the warp or curling upon curing and the flexibility of a coat film, a polyol (B) can be added to lower the crosslinking density. In this case, the two kinds of polyols have to be used in a weight ratio (as solid content) of (Polyol A):(Polyol B)=40:60–90:10, thereby all the properties are well balanced. If Polyol B is used in an weight ratio exceeding this range, the crosslinking density is lowered excessively whereby the properties of the coat film such as heat resistance, chemical resistance and the like are remarkably deteriorated.

On the other hand, when a polyol (C) is cured with a blockisocyanate (Xa), unsatisfactory results can only be obtained, regarding the curling upon curing and the flexibility of the resulting coat film, and therefore, a polyol (B) must be used together therewith. In this case, the two kinds of polyols are preferably used in a weight ratio (as solid content) of (Polyol C):(Polyol B)=20:80–50:50, whereby all the properties are balanced. If Polyol C is used in a weight ratio smaller than this range, the crosslinking density is lowered excessively whereby the properties of the coat film such as heat resistance and chemical resistance and the like are remarkably deteriorated, while if Polyol C is used in a higher weight ratio, the crosslinking density is increased excessively whereby the low shrinkage upon curing and the flexibility of the coat film are deteriorated.

The reason why the double bonds in the butadiene skeleton have been added with hydrogen atoms with respect to a polyol (A), a polyol (B) and a polyblock isocyanate (Xa) is with the view of preventing the coat film from being hardened excessively and the curling from being increased due to the (oxidation) reaction of the double bonds at elevated temperatures.

As a hydrogenated polybutadiene polyol (A), any ploybutadiene polyol with a number-average molecular weight of 1,000–8,000 and having 2–10 hydroxyl groups per molecule, whose double bonds in the butadiene skeleton have been added with hydrogen atoms (i.e., hydrogenated) may be used. Examples thereof include commercially available "GI-1000" and "GI-3000" (both manufactured by Nippon Soda Co., Ltd.) and those obtainable by hydrogenating commercially available polybutadienes such as "G1000" and "GQ1000" (both manufactured by Nippon Soda Co., Ltd.) and "R-45EPI" (manufactured by Idemitsu Petrochemical).

As a hydrogenated polybutadiene polyblock isocyanate (Xa), any polybutadiene polyblock isocyanate with a number-average molecular weight of 1,000–8,000 and having 2–10 blockisocyanate groups per molecule, whose double bonds in the butadiene skeleton have been hydrogenated, may be used. Examples thereof include those obtainable by blocking, with a blocking agent, a commercially available polybutadiene polyisocyanete such as "TP1002" (manufactured by Nippon Soda Co., Ltd.) or "HTP-9" (manufactured by Idemitsu Petrochemical), followed by hydrogenating, and those obtainable by reacting a commercially available OH-terminated hydrogenated polybutadiene such as "GI-1000" or "GI-3000" (both manufactured by Nippon Soda Co., Ltd.) with a diisocyanate in an amount of two gram equivalents per one gram equivalent of the hydroxyl groups in the OH-terminated polybutadiene to obtain the corresponding isocyanate-terminated compound, followed by blocking with a blocking agent. Such blocking agents include, for example, a compound having only one active hydrogen atom which can react with an isocyanate group, per molecule and preferably dissociates again at a temperature below 170° C. after reaction with the isocyanate group, and include, for example, ∈-caprolactam, diethyl malonate, ethyl acetoacetate, acetoxime, methylethylketoxime, phenol, cresol, etc.

As a hydrogenated polybutadiene polyol (B), any polyol with a number-average molecular weight of 13,000–30,000 and having 2–10 hydroxyl groups per molecule, whose double bonds in the butadiene skeleton have been hydrogenated, may be used. Examples thereof include those obtainable by reactimg a hydrogenated polybutadiene polyol having a molecular weight of about 1,000–3,000 such as "GI-1000" or "GI-3000" (both manufactured by Nippon Soda Co.,Ltd.) with a diisocyanate whereby the hydrogenated polybutadiene polyol is increased in moleculer weight to a range of about 13,000–30,000, or those obtainable by reacting a polybutadiene polyol such as "G1000" (manufactured by Nippon Soda Co.,Ltd.) or "R-45EPI" (manufactured by Idemitsu Petrochemical) with a diisocyanate whereby the polybutadiene polyol is increased in molecular weight to a range of about 13,000–30,000, followed by hydrogenating.

As a polyol (C), any polyol with a number-average molecular weight of 200–600 and having 2–10 hydroxyl groups per molecule may be used, irresoective of the resin structure. For example, EO denatured pentaerythritol, "PE555" (manufactured by Toho Chemical Industries Co., Ltd.), EO denatured trimethyrol propane, "TP880" (manufactured by Toho Chemical Industries Co., Ltd.), and polycaprolactone triol, "Prakcel 303", and "Prakcel 305" (manufactured by Dicel Huls).

Moreover, the composition of the present invention may optionally comprise a curing accelerator for polyol and isocyanate, a filler, an additive, a thixotropic agent, a solvent and the like as optional components, in addition to the above essential components. Particularly, in order to improve bending resistance, fine rubber particles may be preferably added. Moreover, fine polyamide particles may be added to further improve adherence to a base copper circuit, a base material such as a polyimide or polyester film, an adhesive layer, etc.

Such fine rubber particles include, for example, any fine particles of resins exhibiting rubber elasticity such as acrylonitrile butadiene rubber, butadiene rubber, acryl rubber, which have been subjected to chemical crosslinking treatment to make insoluble in an organic solvent and infusible. For example, "XER-91" (manufactured by Japan Synthetic Rubber Co., Ltd.), "Staphyloide AC3355", "Staphyloide AC3832" and "IM101" (manufactured by Takeda Chemical Industries, Ltd.), "Paraloide EXL2655" and "Paraloide EXL2602" (manufactured by Kureha Chemical Industries, Co., Ltd.) are encompassed.

Fine polyamide particles include any fine particles of 50 micron or smaller consisting of resin having amide linkages, for example, fatty polyamides such as nylon, aromatic polyamides such as Kevlar, and polyamidoimides. For example, "VESTOSINT 2070" (manufactured by Daicel Huls) and "SP500" (manufactured by Toray Industries, Inc.) may be mentioned.

The method of curing the present curable resin composition in itself is not particularly limited, but carried out according to the conventional methods.

EXAMPLES

The production examples of polyols and block isocyanates to be used in the present invention and examples of the present invention as well as comparative examples will be described to further explain the present invention.

<Production of Resin E>

Ethyl diglycol acetate (manufactured by Daicel Chemical Industries, Ltd.) (165 g), trimethylolpropane (OH equivalwnt=44.72 g/eq.) (33 g),and toluene-2,4-diisocyanate (NCO equivalent=87.08 g/eq.) (132 g) were charged in a reactor, gradually heated to 80° C., and kept at the same temperature for reaction for 2 hours. The isocyanate group content after 2 hours was 10% (NCO equivalent=420 g/eq.). To the resultant mass were added thyl diglycol acetate (manufactured by Daicel Chemical Industries, Ltd.) (79.8 g) and "GI-1000" (OH terminated hydrogenated polybutadiene, Mn=ca 1,500, OH equivalent= 801 g/eq., and solid content=100 wt %: manufactured by Nippon Soda Co., Ltd.) (139 g) over a period of an hour while the mass was being kept at 80° C. Thereafter, the mixture was kept at the same temperature for addition reaction for 4 hours. The isocyanate group content of the resulting product was 4.7% (NCO equivalent=894 g/eq.). The mixture was, while being kept at 80° C., added with metyhlethylketoxine (molecular weight, 87.12) (63.2 g) for a period of 2 hours, and the reaction was continued for an additional hour. The reaction mixture was cooled at the time when FT-IR (Fourier transform infrared spectroscopy) indicated disappearance of the NCO peak at 2,250 cm$^{-1}$, to obtain a resin. The thus obtained resin will be referred to as Resin E.

Properties of Resin E: Mn=ca 1,600, block NCO equivalent (including the solvent)=1,013 g/eq., and solid content= 60 wt %.

<Production of Resin F>

"GI-1000" (OH terminated hydrogenated polybutadiene, Mn=ca 1,500, OH equivalent=801 g/eq., and solid content= 100 wt %: manufactured by Nippon Soda Co., Ltd.) (1,000 g), "Ipsol 150" (manufactured by Idemitsu Petrochemical) (591 g) and dibutyltin laurate (0.1 g) were charged in a reactor, mixed and homogeneously dissolved. The mixture was raised in temperature to 70° C. at the time when the mixture became homogeneous and further stirred while toluene-2,4-diisocyanate (NCO equivalent=87.08 g/eq.) (97.8 g) was added dropwise with stirring over a period of 2 hours. The mixture was kept at the same temperature for an additional hour, and cooled at the time when FT-IR indicated disappearance of the NCO peak at 2,250 cm$^{-1}$, to obtain a resin. The thus obtained resin will be referred to as Resin F.

Properties of Resin F: Mn=ca. 17,000, OH equivalent (including the solvent)=13,521 g/eq., and solid content=65 wt %.

<Production of Resin G>

"TP1002" (NCO terminated polybutadiene, Mn=ca. 1,500, NCO equivalent=1,050 g/eq., and solid content=50 wt %: manufactured by Nippon Soda Co., Ltd.) (1,000 g),and dibutyltin laurate (0.1 g) were charged in a reactor, and heated to 80° C. Thereafter, methylethylketoxime (molecular weight, 87.12) (99.6 g) was added dropwise to the heated mixture over a period of 2 hours. The mixture was kept at the same temperature for reaction for an additional hour, and cooled at the time when FT-IR indicated disappearance of the NCO peak at 2,250 $cm^{-1}$, to obtain a resin. The product will be referred to as Resin G.

Properties of Resin G: Mn=ca. 1,500, block NCO equivalent(including the solvent)=1,154 g/eq., and solid content=54.5 wt %.

<Production of Resin H>

"G-1000" (OH terminated polybutadiene, Mn=ca 1,600, OH equivalent=800 g/eq., and solid content=100 wt %: manufactured by Nippon Soda Co., Ltd.) (1,000 g), "Ipsol 150" (manufactured by Idemitsu Petrochemical) (591g) and dibutyltin laurate (0.1 g) were charged in a reactor, mixed and homogeneously dissolved. The mixture was raised in temperature to 70° C. at the time when the mixture became homogeneous and further stirred while toluene-2,4-diisocyanate (NCO equivalent=87.08 g/eq.) (97.8 g) was added dropwise with stirring over a period of 2 hours. The mixture was kept at the same temperature for an additional hour, and cooled at the time when FT-IR indicated disappearance of the NCO peak at 2,250 $cm^{-1}$, to obtain a resin. The thus obtained resin will be referred to as Resin H.

Properties of Resin H: Mn=ca. 17,000, OH equivalent (including the solvent)=13,523 g/eq., and solid content=65 wt %.

The individual ingredients used in Examples and Comparative Examples will be shown below:

<Hydrogenated polybutadiene polyol (A)>

"GI-1000" (Mn=ca. 1,500, OH equivalent=801g/eq., and solid content=100 wt %: manufactured by Nippon Soda Co., Ltd.)

<Hydrogenated polybutadiene polyblock isocyanate (Xa)>

Resin E (Mn=ca. 1,600, block NCO equivalent (including the solvent)=1,013 g/eq., and solid content=160 wt %)

<Hydrogenated polybutadiene polyol (B)>

Resin F (Mn=ca. 17,000, OH equivalent (including the solvent)=13,521 g/eq., and solid content=65 wt %)

<Polyol (C) >

"PE555" (EO denatured pentaerythritol, Mn=ca. 550, OH equivalent=138 g/eq., and solid content=100 wt %: manufactured by Toho Chemical Industries Co., Ltd.)

<Polyol (A'): non-hydrogenated polybutadiene polyol corresponding to Polyol (A)>

"G-1000" (Mn=ca 1,600, OH equivalent=800 g/eq., and solid content=100 wt %: manufactured by Nippon Soda Co., Ltd.)

<Polyol (Xa'): non-hydrogenated polybutadiene polyblock isocyanate corresponding to (Xa)>

Resin G (Mn=ca 1,500, block NCO equivalent (including the solvent)=1,154.5 g/eq., and solid content=54.5 wt %.

<Polyol (B'): non-hydrogenated polybutadiene polyol corresponding to (B')>

Resin H (Mn=17,000, OH equivalent (including the solvent)=13,523 g/eq., and solid content=65 wt %).

<Fine polyamide particle>

"VENTSINT 2070" (manufactured by Daicel Huls)

<Fine rubber particle>

"EXR-91" (manufactured by Japan Synthetic Rubber Co., Ltd.)

<Preparation of curable resin compositions>

Examples 1–5:

The above polyols (A), (B) and (C), and polyblock isocyanate (Xa), fine rubber particles and fine polyamide particles were properly compounded. Then, as other ingredients, dibutyltin laurate as a curing accelerator, "Aerosil 200" (manufactured by Nihon Aerosil) as an anti-sagging agent, and carbitol acetate as a viscosity adjuster were added in appropriate amounts for each case and mixed, followed by kneading using a three roll mill to prepare Resin composition samples A1–A5 corresponding to Examples 1–5, respectively.

The ingredients of each composition and the results thereof will be shown in Table 1.

Comparative Examples 1–7:

The above polyols (A'), (B') and (C), and polyblock isocyanate (Xa'), fine rubber particles and fine polyamide particles were properly compounded. Then, as other ingredients, dibutyltin laurate as a curing accelerator, "Aerosil 200" (manufactured by Nihon Aerosil) as an anti-sagging agent, and carbitol acetate as a viscosity adjuster were added in appropriate amounts for each case and mixed, followed by kneading using a three roll mill to prepare Comparative resin composition samples B1–B5 corresponding to Comparative Examples 1–5, respectively.

Further, 2 more Comparative resin composition samples B6 and B7 were prepared. The former comprises an epoxy-based overcoat material "CCR-232GF" (manufactured by Asahi chemical research laboratories) and the latter comprises a polyimide-based overcoat material "FS-100L" (manufactured by Ube-kosan Co.,), the two overcoat materials being among those ordinarily used currently for film carriers.

The ingredients of each composition and the results thereof will be shown in Table 2.

<Test pieces>

The thus prepared Resin composition samples A1–A5 and Comparative resin composition samples B1-B were each coated on bases in about 25 μm thickness if cured, and cured under the conditions of 150° C. for 60 minutes, to prepare test pieces.

<Measurement of the properties of coat film>

With respect to the coat films prepared in the above way, the following characteristics were measured or observed.

(1) Warp or curl upon curing shrinkage: Sample is coated (25 mm×35 mm×25 μm) on a polyimide film (35 mm×60 mm×75 μm) , and cured at 150° C. for an hour, and then the degree of warp after curing is measured, and again measured after keeping at 150° C. for 7 hours.

(2) Anti-bending property (bending resistance): Sample is coated on a polyimide film of 75 μm thickness, and cured to prepare a test piece. The test piece is bent at a 180° angle and observed with respect to cracks or whitening when the bent test piece is drawn through nails.

The results are expressed as ×: Cracks occurred, Δ: Whitened, and ○: Nothing abnormal was observed.

(3) Heat resistance upon soldering: Flux JS-64MS-S is coated onto a paint coat, which is soaked in a soldering bath at 260° C. for 10 seconds.

The results are expressed as ○: Nothing abnormal observed, and ×: Blister generated.

(4) Electric insulation: Sample is coated on a tandem electrode (conductor width, 0.318 mm), and electric resistance after boiling for an hour is measured.

(5) Chemical resistance: A paint coat is rubbed with a waste soaked with isopropanol.

The results are expressed as ○: Nothing abnormal observed, and ×: Coating deteriorated.

(6) Adherence (1) onto copper or polyimide: According to JIS D0202, the test is carried out on copper or polyimide.

The results are expressed as ×: 0/100–50/100, Δ: 51/100–99/100, and ○: 100/100.

(7) Adherence (2) onto IC confining resins: Onto a TAB tape whose copper has been etched whereby the adhesive layer is uncovered, a resin composition is coated in about 25 μm thickness and cured to form a coat film. Onto the coat film is coated an IC confining resin in about 200 μm thickness and cured to obtain a test piece. The test piece is bent with hands, while it is being observed how the confining resin peel off.

IC confining resin A: "XS8103 (manufactured by Namics Corp.)

IC confining resin B: "XS8107" (manufactured by Namics Corp.)

The results are expressed as

×: Interfacial failure between the coat film and the IC confining resin,

Δ: Cohesive failure of each of the coat film and the IC confining resin and interfacial failure are both observed, where the cohesive failure < the interfacial failure, ○: Cohesive failure of each of the coat film and the IC confining resin are both observed, where the cohesive failure > the interfacial failure, and ⊙: Cohesive failure is observed with respect to both the coat film and the confining resin.

The test results on the above items of the coat films prepared will be shown in Tables 1 and 2 below.

It can be understood from the tables that coat films when prepared from curable resin compositions of the present invention are, compared with those films prepared from prior-art resin compositions, particularly small in curl increment even after being allowed to stand for a long time at elevated temperatures, and excellent in flexibility, chemical resistance, heat resistance, electric insulation, anti-bending property (bending resistance), and adherence, and these characteristics or properties are well balanced.

TABLE 1

| Examples | A1 | A2 | A3 | A4 | A5 |
|---|---|---|---|---|---|
| Hydrogenated polyol(A): "GI1000" | 10 | 10 | 10 | 10 | 10 |
| Hydrogenated polyblock isocyanate(Xa): Resin E | 12.6 | 13.8 | 22.8 | 13.8 | 13.8 |
| Hydrogenated polyol (B): Resin F | | 15.4 | 10.8 | 15.4 | 15.4 |
| Polyol (C): "PE555" | | | 3 | | |
| Fine polyamide particle: "VENTSINT2070" | | | | 1 | 1 |
| Fine rubber particle: "XER-91" | | | | | 1 |
| Curl (mm): After curing at 150° C. for an hour | 0.8 | 0.3 | 0.4 | 0.3 | 0.3 |
| After curing at 150° C. for 7 hours | 0.9 | 0.4 | 0.6 | 0.4 | 0.4 |
| Anti-bending property | ○ | ○ | ○ | ○ | ○ |
| Heat resistance upon soldering | ○ | ○ | ○ | ○ | ○ |
| Adherence (1) onto: copper | ○ | ○ | ○ | ○ | ○ |
| : polyimide | ○ | ○ | ○ | ○ | ○ |
| Adherence (2) onto: Confining resin A | ○ | ○ | ○ | ○ | ○ |
| Confining resin B | ○ | ○ | ○ | ○ | ○ |
| Chemical resistance: Isopropanol rubbing | ○ | ○ | ○ | ○ | ○ |
| Electric insulation (Ω) | 10th power | 10th power | 10th power | 10th power | 10th power |

TABLE 2

| Comparative Examples | B1 | B2 | B3 | B4 | B5 | B6 | B7 |
|---|---|---|---|---|---|---|---|
| Polyol(A'): "G1000" | 10 | 10 | | 10 | 10 | | |
| Polyblock isocyanate(Xa'): Resin G | 14.4 | 15.7 | 22.8 | 15.7 | 15.7 | | |
| Polyol(B'): Resin H | | 15.4 | 10.8 | 15.4 | 15.4 | | |
| Polyol(C): "PE555" | | | 3 | | | | |
| Fine polyamide particle: "VENTSINT2070" | | | | 1 | 1 | | |
| Fine rubber particle: "XER-91" | | | | | 1 | | |
| Curl(mm): After curing at 150° C. for an hour | 0.7 | 0.3 | 0.4 | 0.3 | 0.3 | 9 | 0.3 |
| After curing at 150° C. for 7 hours | 2.8 | 2.5 | 2.6 | 2.4 | 2.4 | 10.1 | 0.4 |
| Anti-bending property | ○ | ○ | ○ | ○ | ○ | X | ○ |
| Heat resistance upon soldering | ○ | ○ | ○ | ○ | ○ | ○ | ○ |
| Adherence (1) onto: copper | ○ | ○ | ○ | ○ | ○ | ○ | ○ |
| : polyimide | ○ | ○ | ○ | ○ | ○ | ○ | ○ |
| Adherance (2) onto: Confining resin A | ○ | ○ | ○ | ○ | ○ | ○ | X |
| Confining resin B | ○ | ○ | ○ | ○ | ○ | ○ | X |

TABLE 2-continued

| Comparative Examples | B1 | B2 | B3 | B4 | B5 | B6 | B7 |
|---|---|---|---|---|---|---|---|
| Chemical resistance: Isopropanol rubbing | ○ | ○ | ○ | ○ | ○ | ○ | ○ |
| Electric insulation (Ω) | 10th power | 10th power | 10th power | 10th power | 10th power | 9th power | 10th power |

Effects of the Invention

Coat films when prepared from curable resin compositions of the present invention are, compared with those films prepared from prior-art resin compositions, particularly small in curl increment even after being allowed to stand for a long time at elevated temperatures, and excellent in flexibility, chemical resistance, heat resistance, electric insulation, bending resistance, and adherence, and these characteristics or properties are well balanced.

Therefore, the resin composition of the present invention is suitable for overcoat of flexible circuit and also for overcoat of film carriers.

What is claimed is:

1. A curable resin composition for overcoat of flexible circuit which comprises a hydrogenated polybutadiene polyol with a number-average molecular weight of 1,000–8,000 and having 2–10 hydroxyl groups per molecule (Polyol A), a hydrogenated polybutadiene blocked polyisocyanate with a number-average moleculer weight of 1,000–8,000 and having 2–10 blocked isocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of said two polyols is (Polyol A):(Polyol B)=40:60–90:10, and said blocked polyisocyanate (Isocyanate Xa) is present in an amount of 0.8–3.5 gram equivalents based on, i.e., per one gram equivalent of, the total hydroxyl groups of the two polyols (Polyol A plus Polyol B).

2. A curable resin composition for overcoat of flexible circuit which comprises a polyol with a number-average molecular weight of 200–600 and having 2–10 hydroxyl groups per molecule (Polyol C), a hydrogenated polybutadiene blocked polyisocyanate with a number-average molecular weight of 1,000–8,000 and having 2–10 blocked isocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of the two polyols is (Polyol C):(Polyol B)=20:80–50:50 and said blocked polyisocyanate (Isocyanate Xa) is present in an amount of 0.8–3.5 gram equivalents based on one gram equivalent of the total hydroxyl groups of the polyols.

3. A curable resin composition for overcoat of flexible circuit which comprises a hydrogenated polybutadiene polyol with a number-average molecular weight of 1,000–8,000 and having 2–10 hydroxyl groups per molecule (Polyol A), a polybutadiene blocked polyisocyanate (Isocyanate X), and fine rubber particles and/or fine polyamide particles.

4. A curable resin composition for overcoat of flexible circuit which comprises a hydrogenated polybutadiene polyol with a number-average molecular weight of 1,000–8,000 and having 2–10 hydroxyl groups per molecule (Polyol A), a hydrogenated polybutadiene blocked polyisocyanate with a number-average molecular weight of 1,000–8,000 and having 2–10 blocked isocyanate groups per molecule (Isocyanate Xa), and fine rubber particles and/or fine polyaminde particles, said hydrogenated polybutadiene blocked polyisocyanate (Isocyanate Xa), being present in an amount of 0.8–3.5 gram equivalents based on (i.e., per) one gram equivalent of the total hydroxyl groups of said Polyol A.

5. The curable resin composition for overcoat of flexible circuit as set forth in claims 1 or 2, which further comprises fine rubber particles and/or fine polyamide particles.

6. A film carrier coated on the circuit pattern surface side, with an overcoat agent comprising, as the main ingredient, a curable resin composition for overcoat of a flexible circuit as set forth in any one of claims 1–4.

7. A film carrier coated on the circuit pattern surface side, with an overcoat agent comprising, as the main ingredient, a curable resin composition for overcoat of a flexible circuit as set forth in claim 5.

8. A film carrier device which comprises the film carrier as set forth in claim 6.

9. A film carrier device, which comprises the film carrier as set forth in claim 7.

10. A method of overcoating a flexible circuit board, comprising coating a flexible circuit board with a curable resin composition which comprises a hydrogenated polybutadiene polyol with a number-average molecular weight of 1,000–8,000 and having 2–10 hydroxyl groups per molecule (Polyol A), a polybutadiene blocked polyisocyanate (Isocyanate X), and fine rubber particles and/or fine polyamide particles.

11. A method of overcoating a flexible circuit board, comprising coating a flexible circuit board with a curable resin composition which comprises a hydrogenated polybutadiene polyol with a number-average molecular weight of 1,000–8,000 and having 2–10 hydroxyl groups per molecule (Polyol A), a hydrogenated polybutadiene blocked polyisocyanate with a number-average molecular weight of 1,000–8,000 and having 2–10 blocked isocyanate groups per molecule (Isocyanate Xa), and fine rubber particles and/or fine polyaminde particles, said hydrogenated polybutadiene blocked polyisocyanate (Isocyanate Xa), being present in an amount of 0.8–3.5 gram equivalents based on (i.e., per) one gram equivalent of the total hydroxyl groups of said Polyol A.

12. A method of overcoating of flexible circuit board, comprising coating a flexible circuit board with the curable resin composition of claim 1.

13. A method of overcoating a flexible circuit board, comprising coating a flexible circuit board with the curable resin composition of claim 2.

14. An overcoated flexible circuit board, which is prepared by a process comprising:
(A) applying a curable resin composition, wherein said curable resin composition comprises a hydrogenated polybutadiene polyol with a number-average molecular weight of 1,000–8,000 and having 2–10 hydroxyl groups per molecule (Polyol A), a polybutadiene blocked polyisocyanate (Isocyanate X), and fine rubber particles and/or fine polyamide particles, to a flexible circuit board, to obtain a flexible circuit board coated with said curable resin composition; and (B) curing said curable resin composition.

15. An overcoated flexible circuit board, which is prepared by a process comprising:

(A) applying a curable resin composition, wherein said curable resin composition comprises a hydrogenated polybutadiene polyol with a number-average molecular weight of 1,000–8,000 and having 2–10 hydroxyl groups per molecule (Polyol A), a hydrogenated polybutadiene blocked polyisocyanate with a number-average molecular weight of 1,000–8,000 and having 2–10 blocked isocyanate groups per molecule (Isocyanate Xa), and fine rubber particles and/or fine polyaminde particles, said hydrogenated polybutadiene blocked polyisocyanate (Isocyanate Xa), being present in an amount of 0.8–3.5 gram equivalents based on (i.e., per) one gram equivalent of the total hydroxyl groups of said Polyol A, to a flexible circuit board, to obtain a flexible circuit board coated with said curable resin composition; and (B) curing said curable resin composition.

16. An overcoated flexible circuit board, which is prepared by a process comprising:

(A) applying a curable resin composition, wherein said curable resin composition comprises a hydrogenated polybutadiene polyol with a number-average molecular weight of 1,000–8,000 and having 2–10 hydroxyl groups per molecule (Polyol A), a hydrogenated polybutadiene blocked polyisocyanate with a number-average molecular weight of 1,000–8,000 and having 2–10 blocked isocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of said two polyols is (Polyol A):Polyol B)=40:60–90:10, and said blocked polyisocyanate (Isocyanate Xa) is present in an amount of 0.8–3.5 gram equivalents based on, i.e., per one gram equivalent of, the total hydroxyl groups of the two polyols (Polyol A plus Polyol B), to a flexible circuit board, to obtain a flexible circuit board coated with said curable resin composition; and (B) curing said curable resin composition.

17. An overcoated flexible circuit board, which is prepared by a process comprising:

(A) applying a curable resin composition, wherein said curable resin composition comprises a polyol with a number-average molecular weight of 200–600 and having 2–10 hydroxyl groups per molecule (Polyol C), a hydrogenated polybutadiene blocked polyisocyanate with a number-average molecular weight of 1,000–8,000 and having 2–10 blocked isocyanate groups per molecule (Isocyanate Xa), and a hydrogenated polybutadiene polyol with a number-average molecular weight of 13,000–30,000 and having 2–10 hydroxyl groups per molecule (Polyol B), wherein the weight ratio (as solid content) of the two polyols is (Polyol C):(Polyol B)=20:80–50:50 and said blocked polyisocyanate (Isocyanate Xa) is present in an amount of 0.8–3.5 gram equivalents based on one gram equivalent of the total hydroxyl groups of the polyols, to a flexible circuit board, to obtain a flexible circuit board coated with said curable resin composition; and (B) curing said curable resin composition.

18. A method of overcoating a flexible circuit board, comprising coating a flexible circuit board with the curable resin composition of claim 5.

19. An overcoated flexible circuit board, which is prepared by a process comprising:

(A) applying the curable resin composition of claim 5 to a flexible circuit board, to obtain a flexible circuit board coated with said curable resin composition; and (B) curing said curable resin composition.

* * * * *

UNITED STATES PATENT AND TRADEMARK OFFICE
CERTIFICATE OF CORRECTION

PATENT NO. : 6,433,123 B2
DATED : August 13, 2002
INVENTOR(S) : Hiroshi Orikabe

It is certified that error appears in the above-identified patent and that said Letters Patent is hereby corrected as shown below:

Column 5,
Line 29, "by reactimg a" should read -- by reacting a --.

Column 13,
Line 35, "(Polyol A):Polyol" should read -- (Polyol A) : (Polyol --.

Signed and Sealed this

Eleventh Day of March, 2003

JAMES E. ROGAN
*Director of the United States Patent and Trademark Office*